United States Patent
Lee et al.

(10) Patent No.: US 7,414,303 B2
(45) Date of Patent: Aug. 19, 2008

(54) LEAD ON CHIP SEMICONDUCTOR PACKAGE

(75) Inventors: Sang-Hyeop Lee, Chungcheongnam-do (KR); Se-Yong Oh, Gyeonggi-do (KR); Jin-Ho Kim, Chungcheongnam-do (KR); Chan-Suk Lee, Chungcheongnam-do (KR); Min-Keun Kwak, Chungcheongnam-do (KR); Sung-Hwan Yoon, Chungcheongnam-do (KR); Tae-Duk Nam, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/078,640

(22) Filed: Mar. 11, 2005

(65) Prior Publication Data
US 2005/0212099 A1    Sep. 29, 2005

(30) Foreign Application Priority Data
Mar. 23, 2004   (KR) .................... 10-2004-0019664
Nov. 16, 2004   (KR) .................... 10-2004-0093481

(51) Int. Cl.
*H01L 23/495* (2006.01)
*H01L 21/00* (2006.01)
(52) U.S. Cl. ............... 257/676; 257/666; 257/E23.039; 438/111; 438/112; 438/123
(58) Field of Classification Search ................ 257/676, 257/E23.039; 438/123, 111, 112
See application file for complete search history.

(56) References Cited

U.S. PATENT DOCUMENTS 5,834,831 A * 11/1998 Kubota et al. ............ 257/674
5,943,557 A * 8/1999 Moden ..................... 438/118
5,988,707 A    11/1999 Abe et al.
6,013,109 A * 1/2000 Choi ....................... 438/124
6,248,426 B1 * 6/2001 Olson et al. .............. 428/195.1
6,274,406 B1 * 8/2001 Kitaura .................... 438/111
6,436,732 B2   8/2002 Ahmad
6,635,138 B1 * 10/2003 Choi ....................... 156/230

(Continued)

FOREIGN PATENT DOCUMENTS

CN    97110718    4/1997

(Continued)

OTHER PUBLICATIONS

English language abstract of Korean Publication No. 1998-048271.

(Continued)

*Primary Examiner*—Long K Tran
(74) *Attorney, Agent, or Firm*—Marger Johnson & McCollom, P.C.

(57) ABSTRACT

The present invention provides an LOC package wherein the lead frame is in direct contact with the semiconductor device. The lead frame, which includes openings, is positioned directly on the semiconductor device. An adhesive material is applied in the opening in the lead frame. This adhesive material contacts both the lead frame and the semiconductor device. The lead frame is therefore securely held to the semiconductor device. Wires can then be bonded to contact pads on the semiconductor device and to the lead frame.

19 Claims, 15 Drawing Sheets

U.S. PATENT DOCUMENTS

| | | | |
|---|---|---|---|
| 7,037,756 B1 * | 5/2006 | Jiang et al. | 438/109 |
| 2001/0016371 A1 | 8/2001 | Tsubosaki et al. | |
| 2002/0061607 A1 * | 5/2002 | Akram | 438/118 |
| 2002/0146864 A1 * | 10/2002 | Miyaki et al. | 438/123 |
| 2003/0082845 A1 * | 5/2003 | Hoffman et al. | 438/106 |
| 2004/0140541 A1 * | 7/2004 | Shimanuki | 257/666 |

FOREIGN PATENT DOCUMENTS

| | | |
|---|---|---|
| JP | 11-045904 | 2/1999 |
| JP | 11-135704 | 5/1999 |
| JP | 2000-031200 | 1/2000 |
| KR | 56-104459 | 8/1981 |
| KR | 1998-029921 | 7/1998 |
| KR | 1998-048271 | 9/1998 |

OTHER PUBLICATIONS

English language abstract of Japanese Publication No. 2000-031200.
English language abstract of Japanese Publication No. 11-135704.
English language abstract of Japanese Publication No. 11-045904.

* cited by examiner 899  822  851

851
924
899
822

US 7,414,303 B2

LEAD ON CHIP SEMICONDUCTOR PACKAGE

CROSS-REFERENCE TO RELATED APPLICATIONS

This U.S. non-provisional patent application claims priority under 35 U.S.C. § 119 of Korean Patent Application P2004-0019664 filed Mar. 23, 2004 and Korean Patent Application No. P2004-0093481 filed Nov. 16, 2004, the entire contents of which are hereby incorporated by reference.

FIELD OF THE INVENTION

The present invention relates to packaging semiconductor devices and more particularly to packaging semiconductor devices using a lead frame.

BACKGROUND OF THE INVENTION

There are a wide variety of packaging technologies that have been used for semiconductor devices. One of the widely used packaging technologies is termed Lead On Chip (LOC).

In LOC packaging a lead frame is positioned near the semiconductor device and wires are then bonded to pads on the chip and to the lead frame. Generally the wires are bonded to pads on the chip and to the lead frame using ultrasonic wire bonding technology. After the lead frame is connected to the semiconductor device the entire assembly is encapsulated.

In many LOC packages, the lead frame is connected to the chip with a layer of adhesive material. For example, see U.S. Patent Publication No. 2001/0016371. The layer of adhesive material between the lead frame and the chip creates various problems. For example, if pressure is applied to secure the adhesive material to the chip and to the frame, this can damage the semiconductor chip. Another potential problem is created by the fact that the layer of adhesive material separates the lead frame from the semiconductor chip. This separation can create a space into which packaging material can flow, causing potential failure sites.

SUMMARY OF THE PRESENT INVENTION

The present invention provides an LOC package wherein the lead frame is in direct contact with the semiconductor device. The lead frame, which includes openings, is positioned directly on the semiconductor device. An adhesive material is applied in the opening in the lead frame. This adhesive material contacts both the lead frame and the semiconductor device. The lead frame is therefore securely held to the semiconductor device. Wires can then be bonded to contact pads on the semiconductor device and to the lead frame.

In one embodiment of the invention, an ultra violet curable adhesive is used. After this adhesive material is applied, it is cured by the application of ultra violet light.

The package can be assembled using a die that has a plurality of holes and the following procedure. First, semiconductor devices are placed in these holes. Next, lead frames are positioned on top of the semiconductor devices. An adhesive material is then applied, at least in the spaces between the leads in the lead frame. The adhesive material contacts both the lead frame and the surface of the semiconductor device. After the adhesive is cured it holds the lead frame securely to the semiconductor device.

DETAILED DESCRIPTION

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided to convey the scope of the invention to those skilled in the art.

It is noted that the figures are not drawn to scale. Rather, for simplicity and clarity of illustration, the dimensions of some of the elements are exaggerated for clarity. It is also noted that well-known structures and processes have not been described or illustrated to avoid obscuring the essence of the present invention.

Figure 1A:
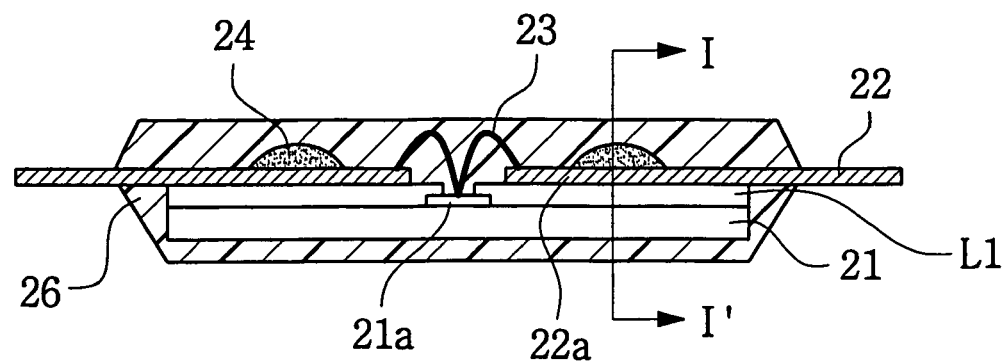
FIG. 1A shows a side view of a first embodiment of the invention.
Figure 1B:
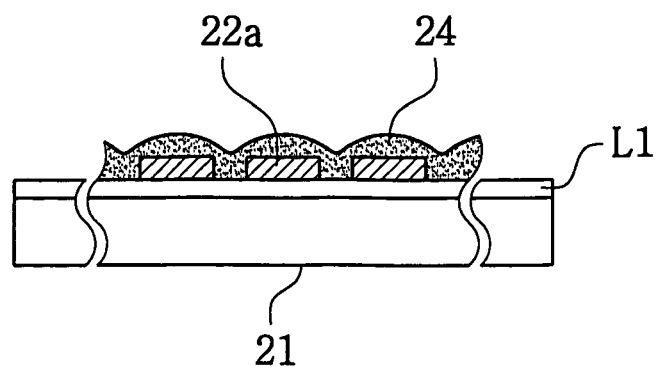
FIG. 1B is a view taken along line I-I' in FIG. 1A.

FIG. 1A is a cross section view of a Lead-on-chip (LOC) semiconductor package that incorporates a first embodiment of the present invention. FIG. 1B is a cross section view taken along line I-I' in FIG. 1A.

The LOC package shown in FIGS. 1A and 1B includes a semiconductor chip 21, a lead frame 22, and bonding wires 23. The chip 21 has conventional bonding pads 21a and a conventional insulating layer L1. As is conventional, the insulating layer L1 covers the surface of chip 21 except for the bonding pads 21a. The insulating layer L1 may be a passivation layer or a polyimide layer. The bonding wires 23 connect the bonding pads 21a (and thus the chip circuitry which is not shown in the drawings) to the lead frame 22.

The lead frame 22 includes inner leads 22a, which extend toward the chip pads 21a. Adhesive material 24 mechanically connects and holds the inner leads 22a to the chip 21. The adhesive 24 can extend over and around the lead frame elements as shown in FIG. 1B, or the adhesive 24 can be located only between the lead frame elements as shown in the alternate embodiment illustrated in FIG. 1C.

In the specific embodiments described herein, the adhesive 24 is a UV (that is UV light) curable adhesive such as the commercially available adhesive known as adhesive EW707 series marketed by Polysciences, Inc. of 400 Valley Road, Warrington, Pa. While the embodiments described herein use the particular adhesive named above, it should be understood that various other types of adhesive may also be used.

It is specifically noted that the adhesive layer 24 binds the leads 22a to the chip 21; however, there is no adhesive under the lead frame 22. That is, there is no adhesive between the leads 22a and the chip 21 and no space between the leads 22a and the chip 21. Thus, the leads 22a and the lead frame 22 are in contact with the upper surface of the semiconductor chip 21. Stated differently, there is no gap between the lead frame 22 and the chip 21. The close proximity of the lead frame 22 to the chip 21 has a number of advantages including improved positional stability, reduced thickness of the package, and the elimination of a gap into which packaging material can flow. Furthermore the use of a UV curable adhesive eliminates damage due to thermal shock, which can result from the use of a heat curable adhesives.

Figure 1C:
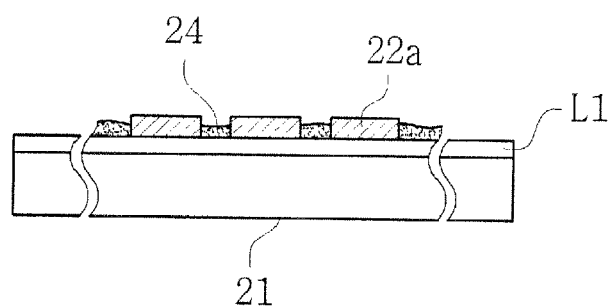
FIG. 1C is a view of an alternate embodiment of the invention.

The specific embodiments illustrated in FIGS. 1A, 1B and 1C are related to semiconductor chips with center pads; however, the invention can be used with semiconductor chips having pads at various other locations on the chip.

A particular technique for manufacturing the package shown in FIGS. 1A, 1B and 1C will now be described. It should, however, be understood that various other manufacturing techniques may also be used.

Figure 2:
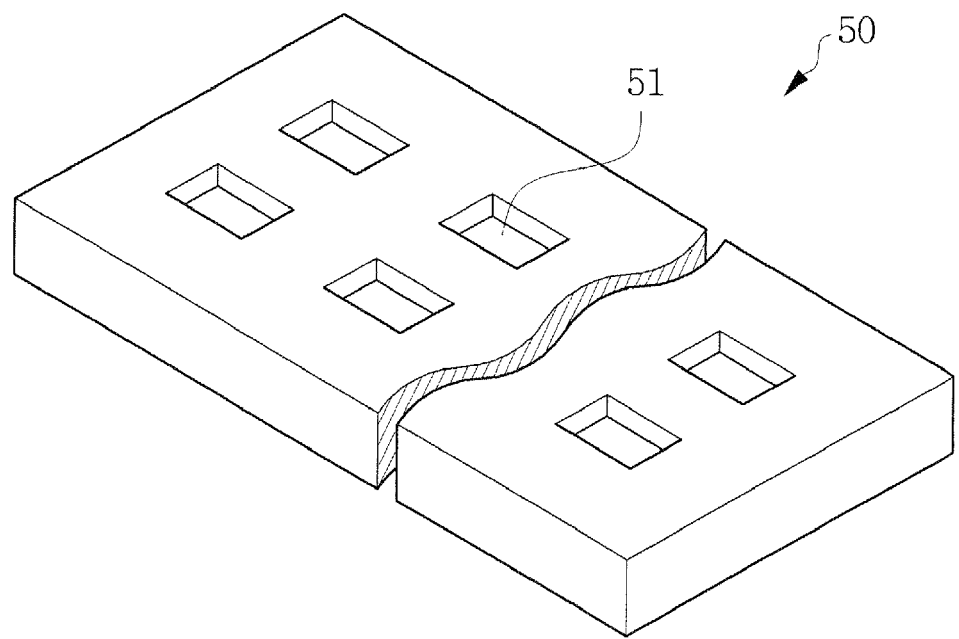
FIG. 2 is a perspective view of a die that can be used to assemble the package.

FIG. 2 shows a chip mounting jig 50, which includes chip mounting groves 51 for receiving semiconductor chips. While the jig 50 has six holes for receiving chips, it should be understood that the number of holes in the jig is a matter of engineering choice and that the jig may include many more such holes. The jig 50 can, for example, be made from a conventional stainless steal (SUS) alloy.

Figure 3A:
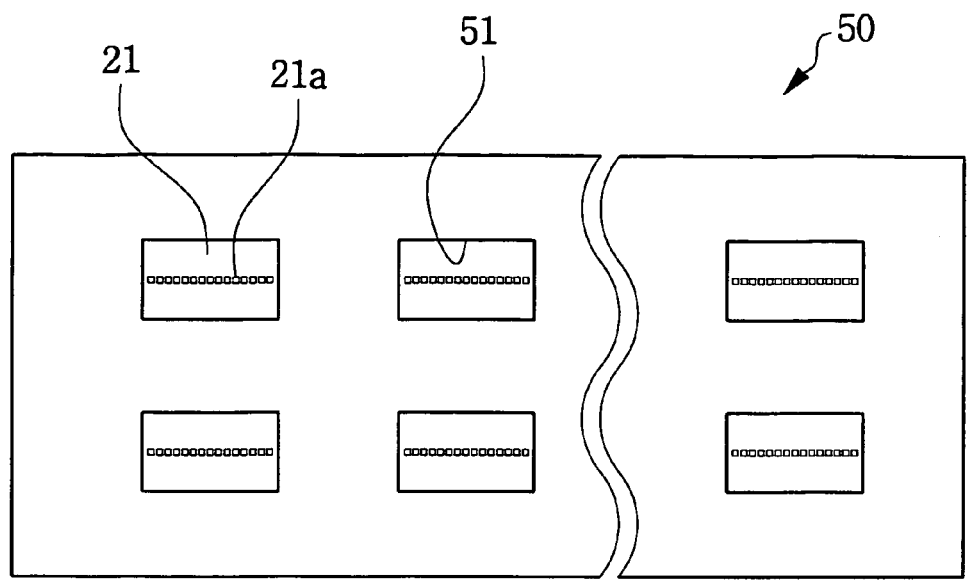
FIGS. 3A to 3D show how the device can be assembled.
Figure 3B:
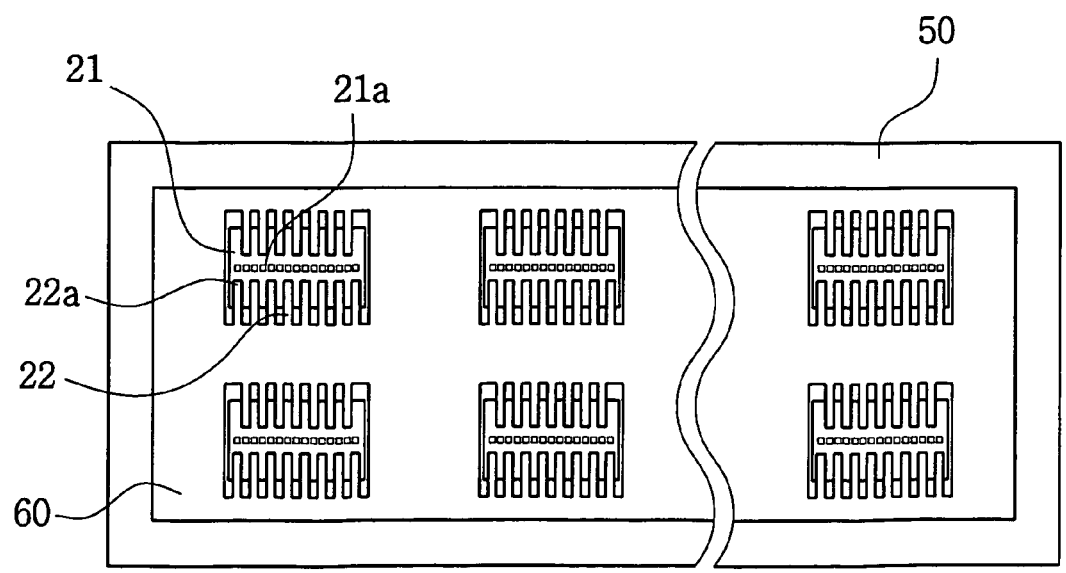
Figure 3C:
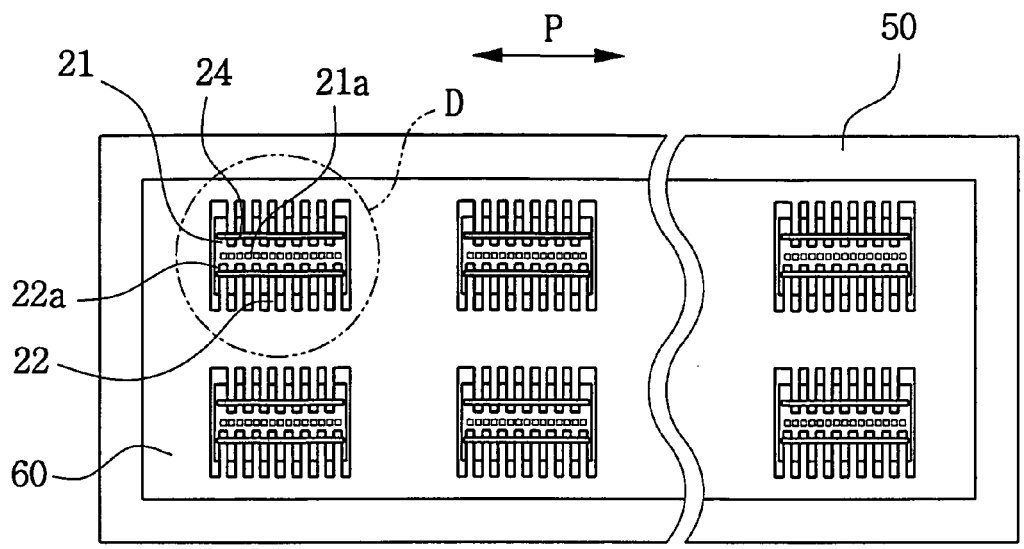
Figure 3D:
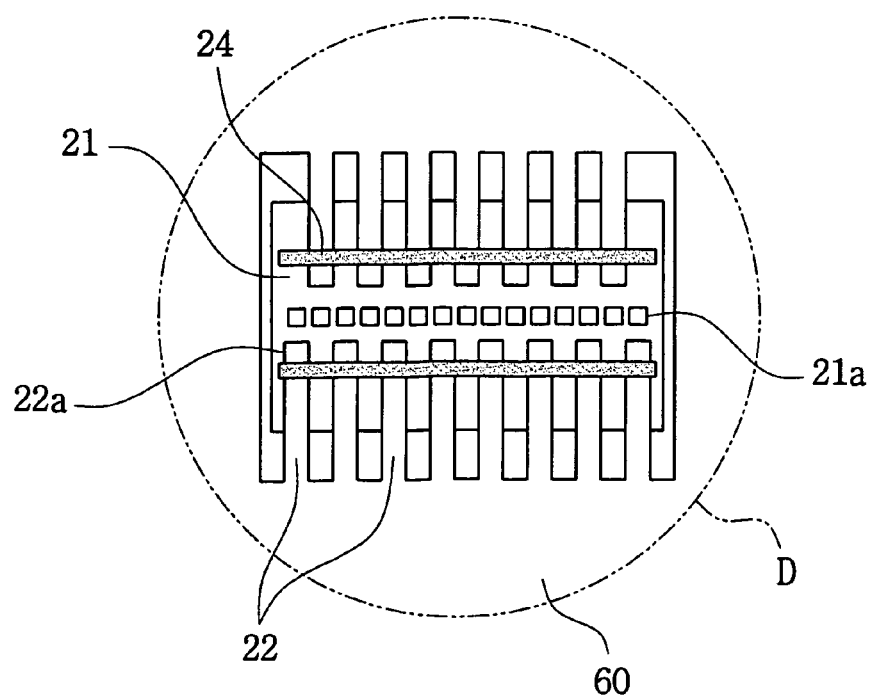

FIGS. 3A, 3B, 3C and 3D show overall diagrams of steps in the process, and FIGS. 4A to 4H show more detailed views of steps in the process. FIG. 3D shows more detail one of the chips and lead frames shown in FIG. 3C. The area shown in FIG. 3D is indicated by the circle D in FIG. 3C.

The overall operation will first be explained with reference to FIGS. 3A to 3D. First, semiconductor chips 21 are positioned in the chip mounting groves 51 of the jig 30. This may be done by a conventional chip picking machine (not shown) which picks the chips from a chip tray (not shown) and moves them to the groves 51 in the jig 50.

Next, as illustrated in FIG. 3B (and in the more detailed FIG. 3D), a lead frame strip 60 is positioned on top of the jig 50. The led frame strip 60 includes a plurality of lead frames 22, as is conventional. The lead frame strip 60 is positioned so that the inner leads 22a are in a close relationship to the upper surface of the semiconductor chips 21, that is, to the insulating layer L1 shown in FIGS. 1A, 1B and 1C.

As indicated in FIG. 3C, an UV adhesive 24 is applied onto the inner leads 22a and to the semiconductor chip 21 along a strip in the direction indicated by the arrow P in FIG. 3C. The UV adhesive may surround the inner leads, as shown in FIG. 1B, or the adhesive may be only positioned between the leads, as shown in the alternate embodiment illustrated in FIG. 1C.

Figure 4A:
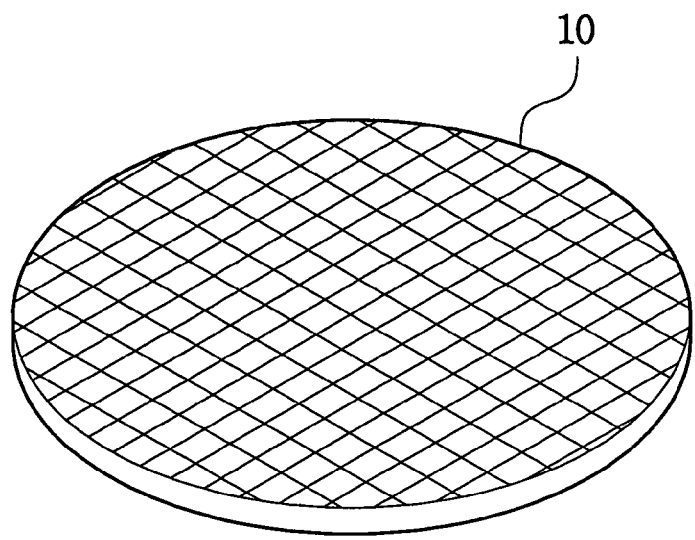
FIGS. 4A to 4H show more detail about the devices at various stages of the assembly process.
Figure 4B:
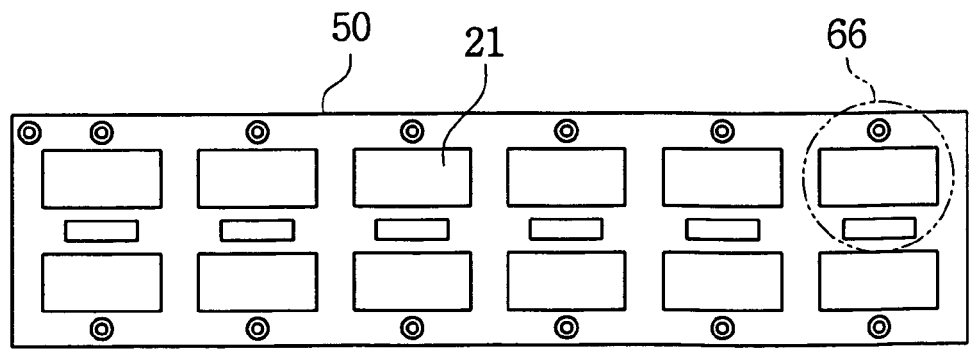
Figure 4C:
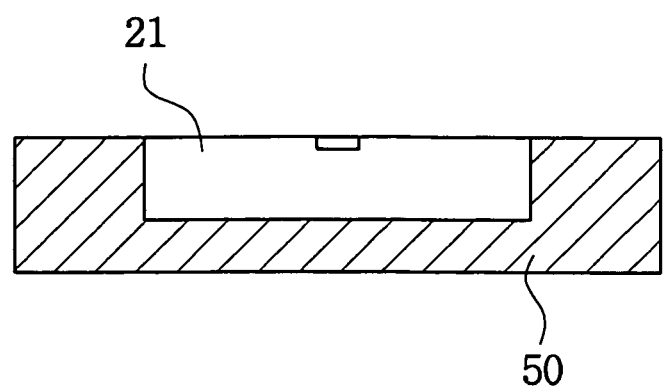

A more detailed view of the various steps is illustrated in FIGS. 4A to 4H. First, a wafer 10 is divided into chips 21. The chips are placed in the jig 50 as illustrated in FIG. 4B. FIGS. 4C to 4H relate to the single chip area indicated by the circle 66 in FIG. 4B. FIG. 4C illustrates the chip 21 in the jig 50.

Figure 4D:
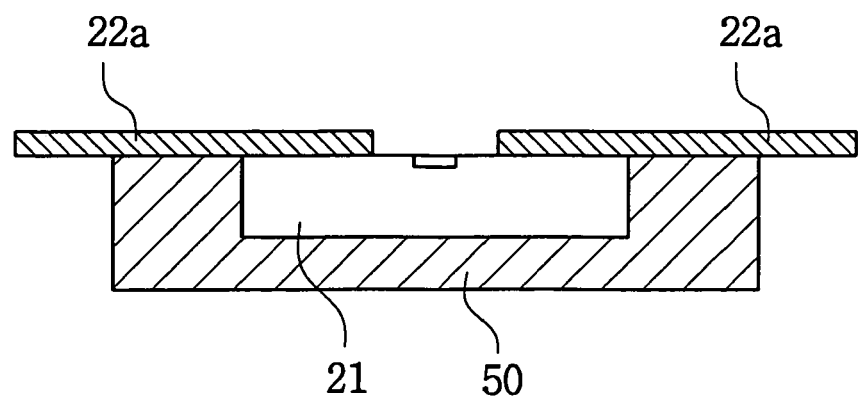
Figure 4E:
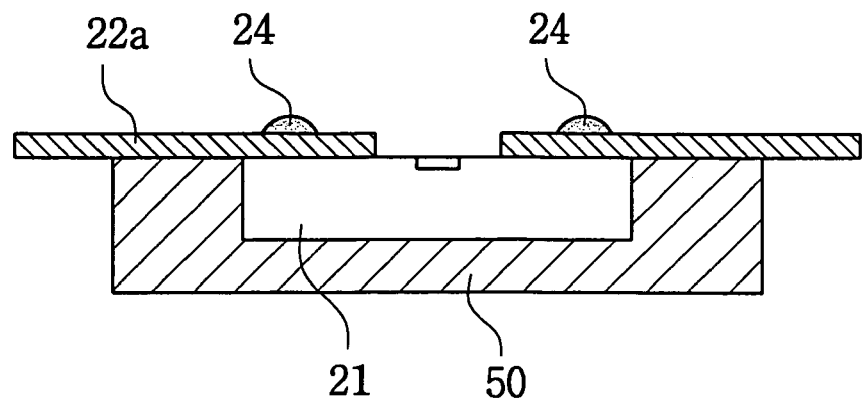

FIG. 4D shows the lead frame leads 22a positioned on top of the chip 21. This is a more detailed illustration of what is shown in FIG. 3B. FIG. 4E shows the adhesive 24 positioned on and around the leads 22a, as illustrated in FIG. 3C.

Figure 4F:
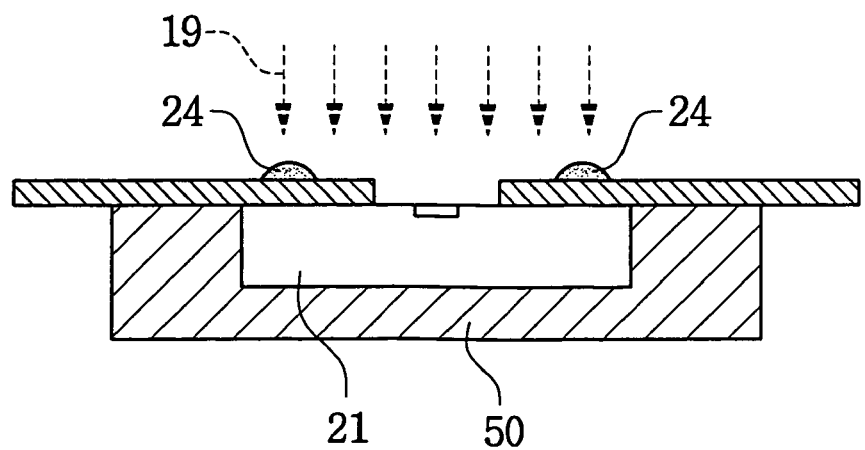
Figure 4G:
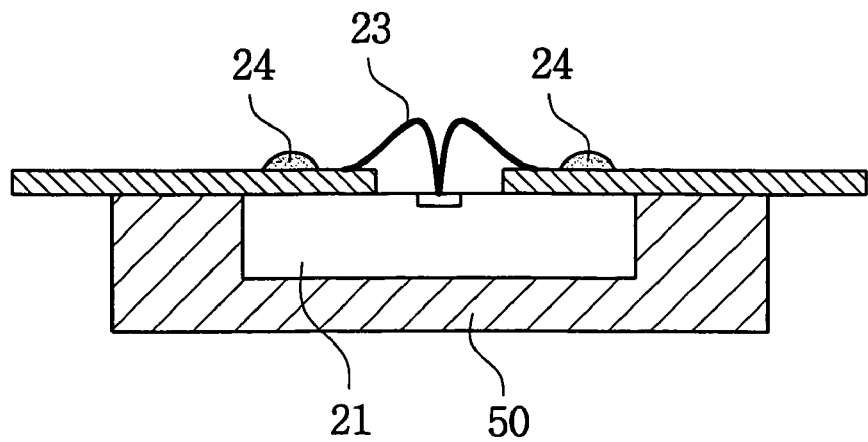
Figure 4H:
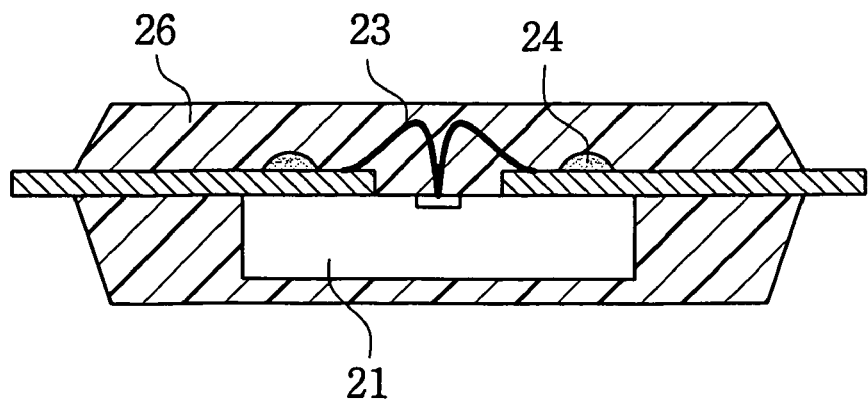

FIG. 4F illustrates UV radiation (illustrated by the arrows 19) being applied to the adhesive 245. FIG. 4G illustrates the wires 23 connected to the chip pads and the lead frame. The wires are bonded in a conventional manner by a conventional wire bonding technique. Finally, FIG. 4H illustrates the chip encapsulated with material 26. This encapsulation is performed in a conventional manner.

An alternate embodiment of the invention includes an additional cure step, that is, a second, UV curing step. In one alternate embodiment, the second curing step is performed after the wire bonding step. This second curing step may prevent deformation of the inner leads 22a which can result from mechanical shock. The second curing step may also improve the bonding between the semiconductor chip 21 and the inner leads 22a. The number of UV cure steps used, the intensity of the UV light and the duration of the UV cure steps are a function of the particular adhesive used. A sufficient amount of light must be used to adequately cure the particular adhesive selected for use in any particular application.

Still another embodiment of the invention includes an oven cure step after the first UV cure step and before the wire bonding step. This oven cure step can be at a temperature that insures that the adhesive is completely cured. For example, the oven cure step may be an over cure at 170 degrees centigrade.

It is noted that the wire bonding step may be performed in the same jig used to apply the lead frame, or the chips may be removed from the first jig prior to wire bonding and the wire bonding can be performed in a separate jig.

Figure 5A:
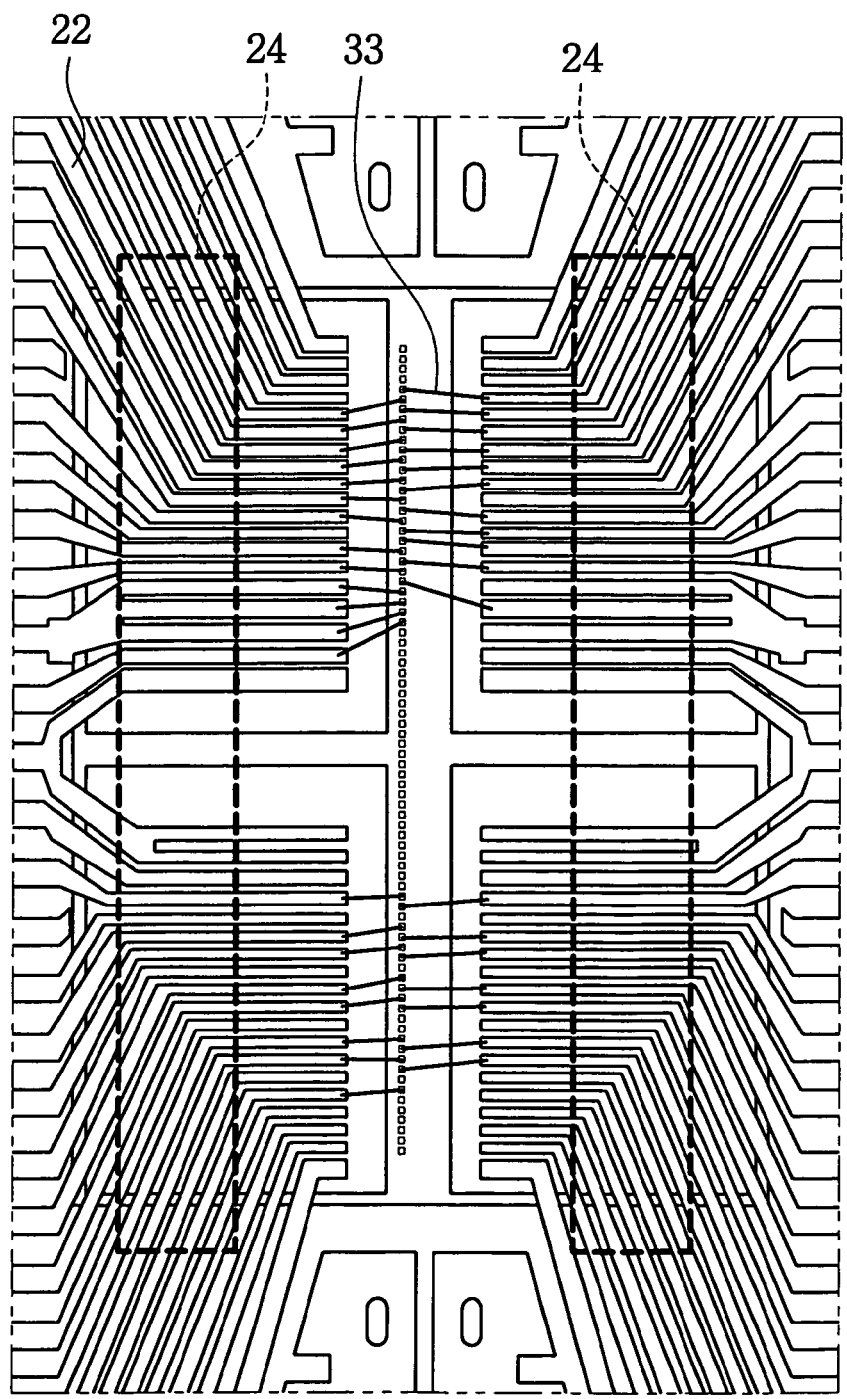
FIG. 5A is a top view of a first embodiment of the invention.
Figure 5B:
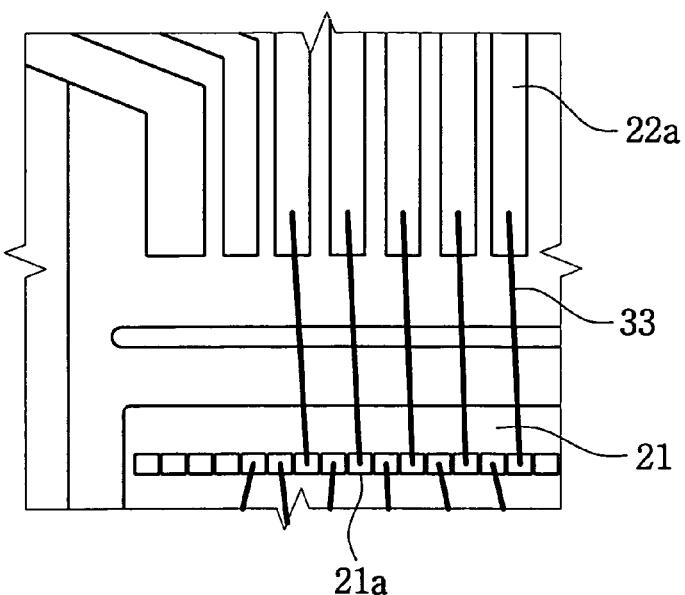
FIG. 5B is a more detailed top view.

FIG. 5A is an overall top view of the lead frame 22 and the chip 21. FIG. 5A illustrates the position of the adhesive 24 on the leads 22a. FIG. 5B is a more detailed view of a portion of the lead frame 22 and the chip 21, showing the leads 22a, the chip pads 21a and the wires 33 connecting the chip pads 21a to the leads 22a.

Figure 6:
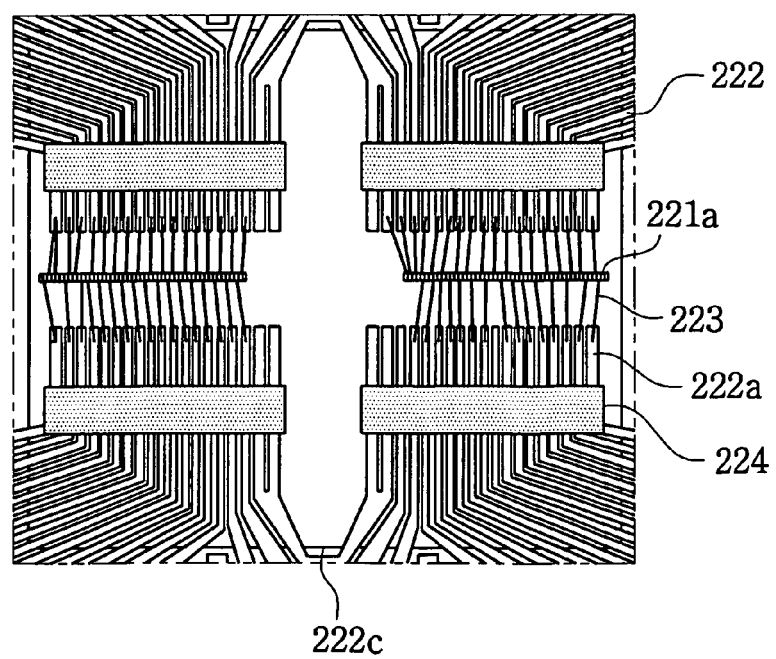
FIG. 6 is a top view of a second embodiment of the invention.

An alternate embodiment of the invention is shown in FIG. 6. FIG. 6 illustrates a lead frame 222, chip pads 221a, adhesive 224, and wires 223 connecting the lead frame 222 to the chip pads 222. The leads on lead frame 222 have two portions designated 222a and 222c. In this alternate embodiment, the portion 222a is longer than in the previous embodiment in order to accommodate and make additional room for the adhesive strip 224.

Figure 7A:
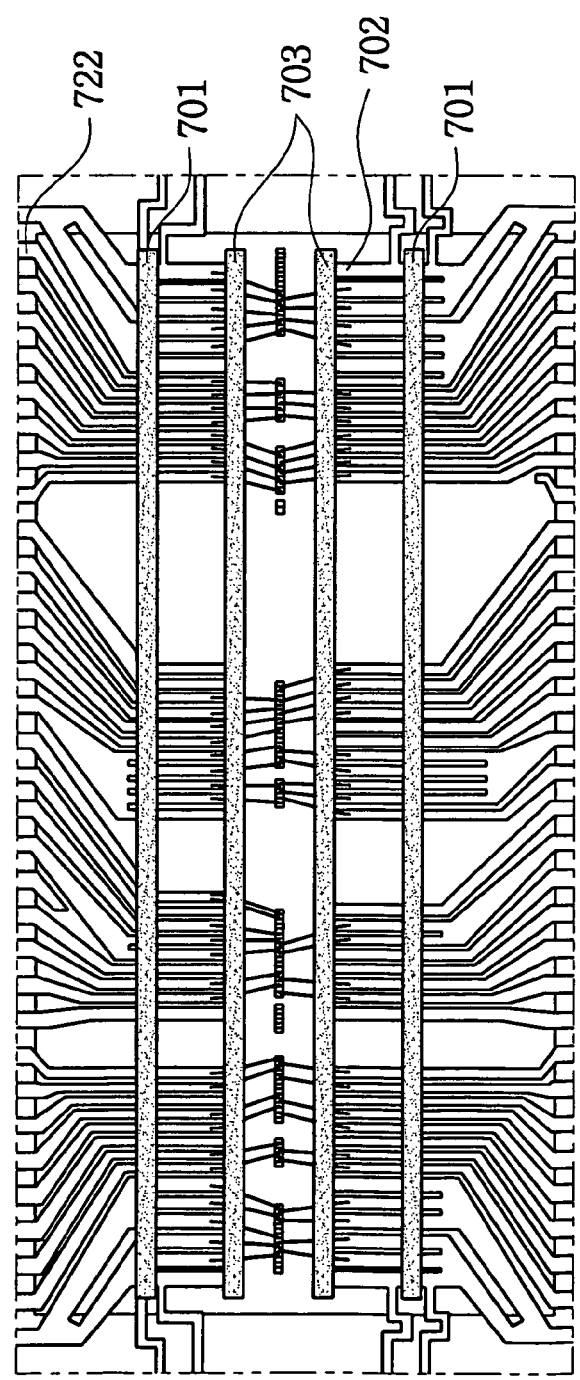
FIGS. 7A, 7B and 7C are top views of two other embodiments of the invention.
Figure 7B:
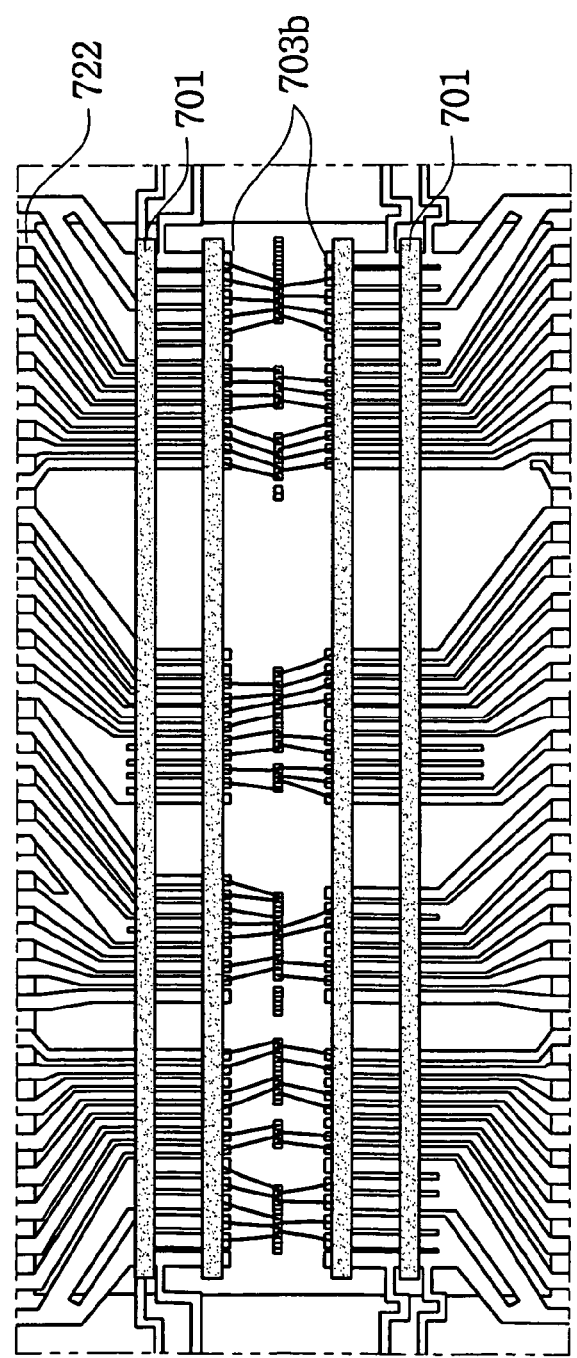
Figure 7C:
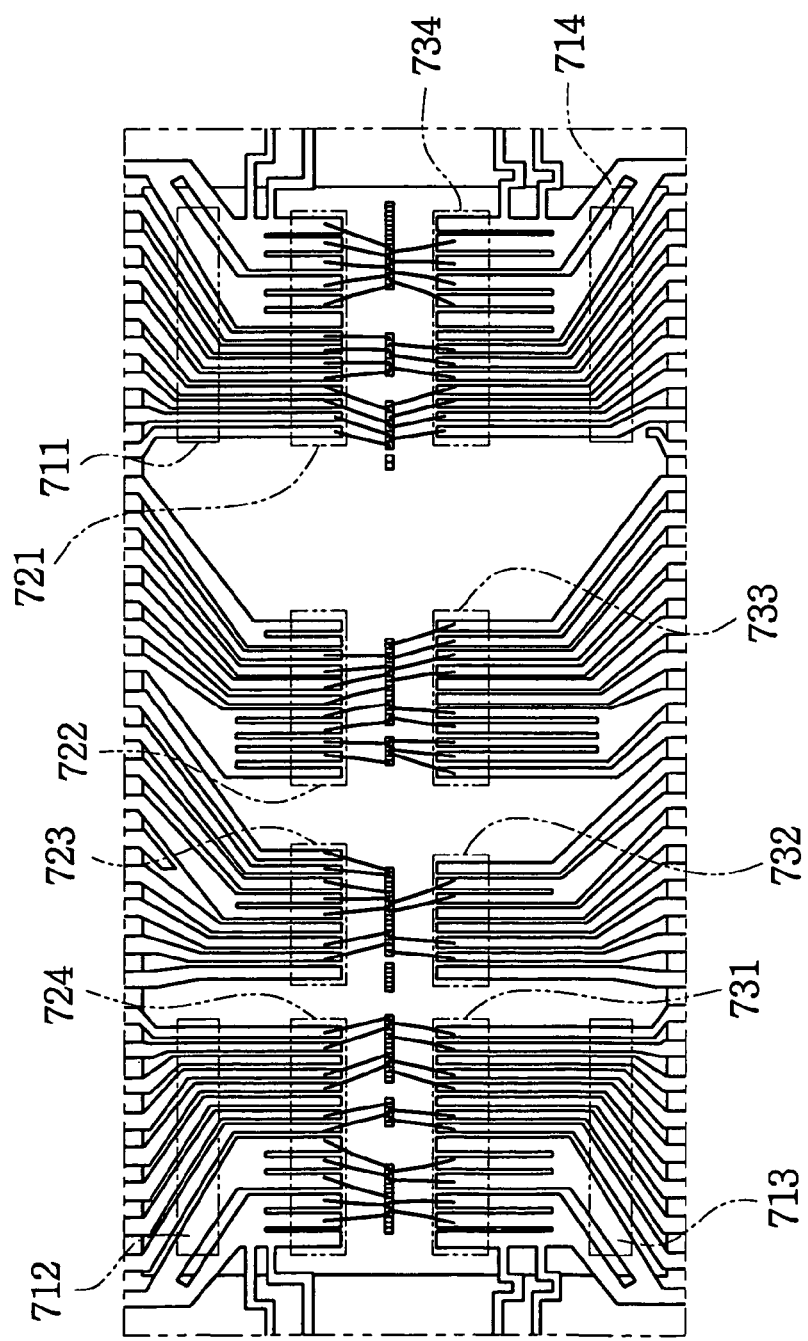

Three additional embodiments of the invention are shown in FIGS. 7A, 7B and 7C. The embodiment shown in FIG. 7A includes a lead frame 722 and two strips of UV curable adhesive 701 and 703. The additional strips of UV adhesive 703 provides additional bonding. Strip 703 is positioned near the tips of the leads adjacent to the locations 702 to which wires are bonded. By positioning the adhesive near the ends of the leads, the chip is prevented from tilting. The additional strip of adhesive 703 can applied prior to the wire bonding step since strip 703 does not cover the sites 702 to which wires are later bonded. That is, the package shown in FIG. 7A can be fabricated in the following sequence of steps which occur after the lead frame has been placed over the chips: First adhesive 701 is applied and cured to bond the lead frame to the chips, then adhesive 703 is applied and cured to further bond the lead frame to the chips, and finally the wires are bonded to the lead frame and the chip. Alternatively, the adhesive strip 703 can be applied after the wires have been bonded to the lead frame and to the chip.

Another embodiment of the invention is shown in FIG. 7B. In the embodiment shown in FIG. 7B, the UV curable adhesive strip 703B covers the wire bonding sites on the lead frame. In this embodiment the fabrication sequence of steps after the lead frame is positioned on the chips is as follows: First adhesive 701 is applied and cured to hold the lead frame to the chip, next the wires are bonded to the chip and to the lead frame, and finally adhesive strip 703B is applied and cured. In the embodiment shown in FIG. 7B, the adhesive strip 703B covers the sites to which the wires have been bonded, thereby providing additional support of the wires that extend from the lead frame to the chip pads.

Another embodiment of the invention is shown in FIG. 7C. In the embodiment shown in FIG. 7C, the UV curable adhesive is applied at the locations indicated by the rectangles 711 to 714, 721-724, and 731-734. In this embodiment the fabrication sequence of steps after the lead frame is positioned on the chips is as follows: First adhesive is applied and cured in the four corner rectangles 711 to 714. This holds the lead frame to the chip. Next the wires are bonded to the lead frames and to the chip. Finally, UV adhesive is applied and cured in the areas indicated by rectangles 721 to 724 and 731 to 734. It is noted that rectangles 721 to 724 and 731 to 734 overlap the wire bonding sites on the lead frame. Thus, the UV adhesive at locations 721 to 724 and 731 to 734 help hold the wires in place. It is noted that parts and steps of the embodiments shown in FIGS. 7A, 7B and 7C not specifically discussed above are identical to the corresponding elements and steps in the previously described embodiments.

Figure 8A:
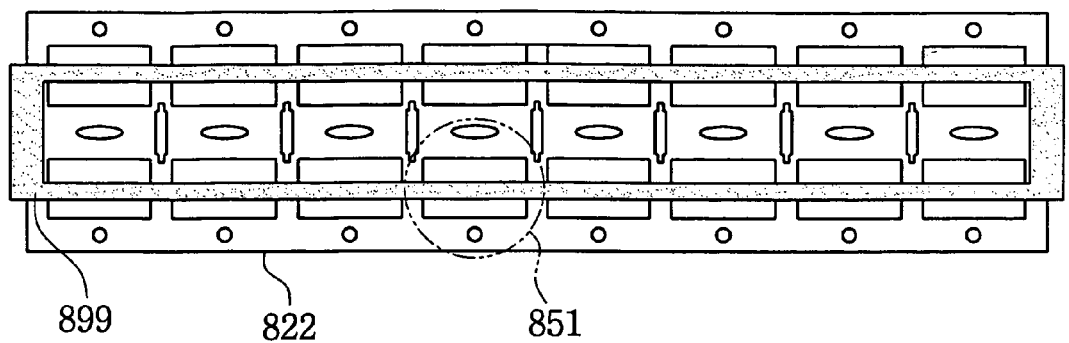
FIGS. 8A and 8B are top views of still another embodiment of the present invention.
Figure 8B:
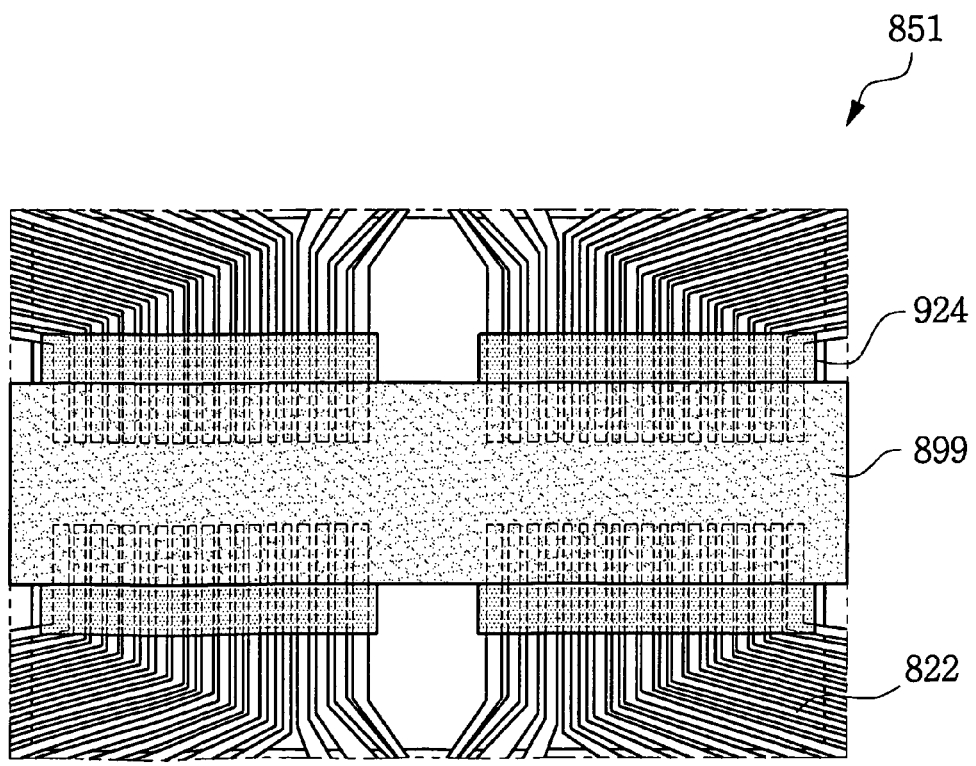

Still another embodiment of the invention is illustrated in FIGS. 8A and 8B. FIG. 8B is an expanded view of the section designated by the circle 851 shown in FIG. 8A. This embodiment includes a lead frame 822 that includes a protective tape 899 over the center portion of the lead frame 822. As shown in FIG. 8B, the protective tape 899 covers the end portions 924 of the leads on frame 822. It is noted that the wires, such as wires 23 in FIG. 1A, are bonded to the ends of the leads. Use of the protective tape as shown in FIGS. 8A and 8B prevents the lead ends from being contaminated when the UV adhesive is applied as previously described.

Figure 9A:
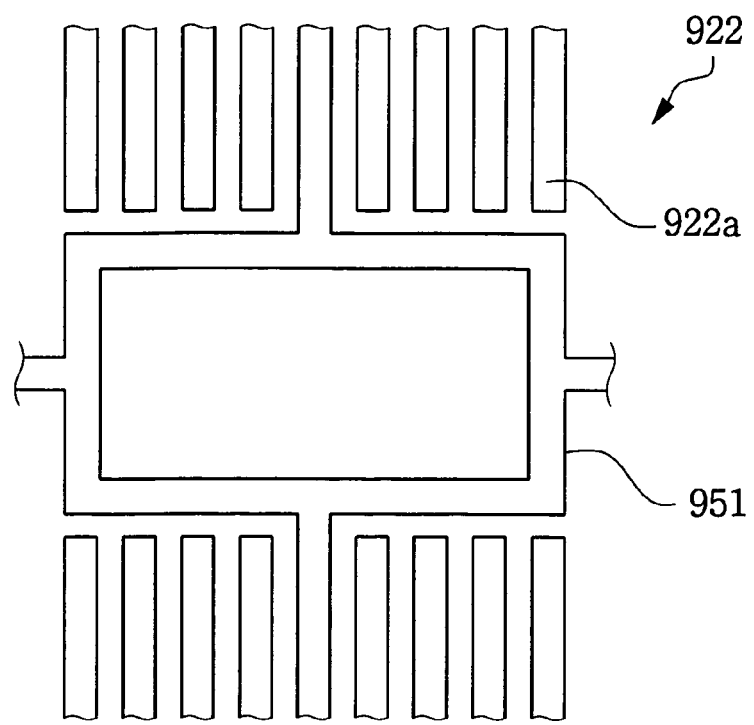
FIGS. 9A and 9B are top views of still another embodiment of the present invention.
Figure 9B:
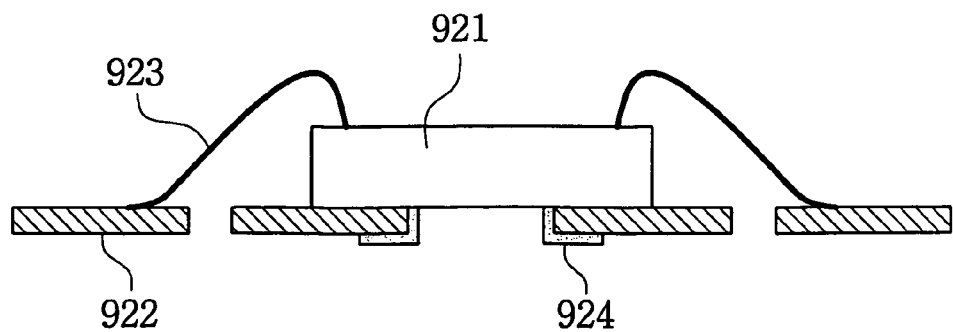

Still another embodiment of the invention is illustrated in FIGS. 9A and 9B. In the embodiment shown in FIGS. 9A and 9B a chip 921 is positioned on top of the lead frame 922 rather than under the lead frame, as in the previously described embodiments. FIG. 9A shows a lead frame 922 that has a central portion 951 on which an integrated circuit chip can be placed. The central portion 951 of the lead frame includes at least one hole.

FIG. 9B shows the chip 921 positioned on the lead frame 922. As in the previous embodiments, the chip is in direct contact with the lead frame. Adhesive 924 is placed in the hole in the lead frame under the semiconductor chip. The adhesive contacts the lead frame and the semiconductor chip. Adhesive 924 holds the chip 921 to the lead frame 922. Wires 923 connect pads on the chip 921 to the leads of the lead frame 922.

Thus in the embodiments shown in FIGS. 9A and 9B, the leads are positioned directly on the bottom surface of said semiconductor chip. In contrast in the embodiments shown earlier, the leads are positioned directly on the top surface of said semiconductor chip.

In still another embodiment of the invention a heat curable adhesive is used. With such an embodiment, sufficient heat is applied to cure the head curable adhesive. An adhesive need be selected which has a low enough cure temperature that the semiconductor chip is not damaged during the cure step.

While the invention has been shown and described with respect to preferred embodiments thereof, it should be understood that various changes may be made in the described embodiments without departing from the spirit and scope of the invention. The scope of the invention is limited only by the appended claims.

We claim:

1. A semiconductor package comprising:
   a semiconductor chip including a plurality of bond pads disposed in a substantially central portion of the semiconductor chip,
   a plurality of spaced apart leads forming a lead frame, the plurality of leads respectively including a plurality of lead ends extending from edges of the semiconductor chip towards the bond pads, said leads being positioned directly on said chip, and
   an adhesive in said space between said leads and in contact with said chip to hold said leads to said chip,
   wherein the leads are positioned on the chip such that spaces are respectively defined between sidewalls of adjacent leads and wherein the adhesive is formed to contact at least a portion of the sidewalls of the leads and to not contact the plurality of lead ends.

2. The semiconductor package of claim 1 wherein said adhesive is a UV curable adhesive.

3. The semiconductor package of claim 1 wherein the top surface of said semiconductor chip is an insulating layer.

4. The semiconductor package of claim 1 wherein said adhesive covers a portion of said leads.

5. The semiconductor package of claim 1 wherein said adhesive is between said leads and below the top surface of said leads.

6. The semiconductor package of claim 1 wherein said adhesive is EW707 series adhesive.

7. The semiconductor package of claim 1 further comprising a plurality of wires to connect the bonding pads of the chip to the leads.

8. The semiconductor package of claim 7 wherein said wires are wire bonded to said pads and to said leads utilizing a wire bonding technique.

9. The semiconductor package of claim 7, further comprising an encapsulating material covering the wires that connect the bonding pads to the leads.

10. The semiconductor package of claim 7, wherein top surfaces of the bonding pads are substantially coplanar with bottom surfaces of the leads.

11. The semiconductor package recited in claim 1 wherein said leads are positioned directly on the top surface of said semiconductor chip.

12. The semiconductor package of claim 1, wherein the adhesive includes a first adhesive formed in at least one space between adjacent lead sidewalls on a first side of the chip, and a second adhesive formed in at least one space between adjacent lead sidewalls on a second side of the chip.

13. A semiconductor package comprising,
   a semiconductor chip, said semiconductor chip having as an integral part thereof an insulating surface layer on the top surface thereof,
   a lead frame positioned directly on said insulating layer that is an integral part of said semiconductor chip such that the lead frame directly contacts at least edge portions of the semiconductor chip,
   said lead frame having a plurality of leads with spaces there between, the plurality of leads respectively including a plurality of lead end, and
   adhesive material contacting the surface of said semiconductor chip in said spaces between said leads without contacting the plurality of lead ends, said adhesive material bonding said lead frame to said semiconductor chip.

14. A semiconductor package comprising:
   a semiconductor chip;
   a lead frame including a plurality of leads spaced apart from each other, the lead frame being in direct contact with a surface of the semiconductor chip, wherein the plurality of leads respectively include a plurality of lead ends; and
   an adhesive formed in spaces between at least a portion of the spaced apart leads to adhere the lead frame to the semiconductor chip, wherein the adhesive is not formed between the lead frame and the semiconductor chip, and not formed to contact the lead ends.

15. The semiconductor package of claim 14, wherein the adhesive covers at least a portion of the plurality of leads.

16. The semiconductor package of claim 14, wherein the adhesive is formed between at least a portion of the spaced apart leads such that a top surface of the adhesive is below the top surface of the plurality of leads.

17. A semiconductor package comprising:
 a semiconductor chip;
 a lead frame including a plurality of spaced apart leads arranged to laterally extend from first and second sides of the chip toward a center portion of the chip and respectively ending at lead ends, the leads positioned directly on a surface of the semiconductor chip;
 a first adhesive formed in spaces between the leads extending from the first side of the chip; and
 a second adhesive formed in spaces between the leads extending from the second side of the chip, wherein the first and second adhesives are formed to not be in contact with the lead ends.

18. The semiconductor package of claim 17, wherein the chip further comprises bonding pads formed at the center portion of the chip.

19. The semiconductor package of claim 18, further comprising:
 bonding wires respectively connecting the bonding pads of the chip to the plurality of leads; and
 an encapsulant formed over the bonding pads and bonding wires.

* * * * *